(12) United States Patent
Bishel

(10) Patent No.: US 11,348,745 B1
(45) Date of Patent: May 31, 2022

(54) HOME AUTOMATION APPARATUS

(71) Applicant: Richard Anthony Bishel, Beaverton, OR (US)

(72) Inventor: Richard Anthony Bishel, Beaverton, OR (US)

(*) Notice: Subject to any disclaimer, the term of this patent is extended or adjusted under 35 U.S.C. 154(b) by 120 days.

(21) Appl. No.: 16/670,926

(22) Filed: Oct. 31, 2019

Related U.S. Application Data

(60) Provisional application No. 62/753,690, filed on Oct. 31, 2018.

(51) Int. Cl.
| | |
|---|---|
| *B23K 11/24* | (2006.01) |
| *H02B 1/24* | (2006.01) |
| *H01H 9/54* | (2006.01) |
| *H01H 9/16* | (2006.01) |
| *H04L 12/28* | (2006.01) |
| *H03K 17/13* | (2006.01) |
| *H02J 3/14* | (2006.01) |
| *G05B 15/02* | (2006.01) |
| *H01R 31/06* | (2006.01) |

(52) U.S. Cl.
CPC ............... *H01H 9/54* (2013.01); *G05B 15/02* (2013.01); *H01H 9/16* (2013.01); *H01R 31/065* (2013.01); *H02J 3/14* (2013.01); *H03K 17/136* (2013.01); *H04L 12/2818* (2013.01); *G05B 2219/25427* (2013.01); *H01H 2300/03* (2013.01); *H04L 2012/2841* (2013.01)

(58) Field of Classification Search
CPC ........ H01H 9/54; H01H 9/16; H01H 2300/03; G05B 15/02; G05B 2219/25427; H01R 31/065; H02J 3/14; H03K 17/136; H04L 12/2818; H04L 2012/2841
USPC .......................................................... 307/112
See application file for complete search history.

(56) References Cited

U.S. PATENT DOCUMENTS

| | | | |
|---|---|---|---|
| 5,872,832 A | 2/1999 | Bishel et al. | |
| 6,356,038 B2* | 3/2002 | Bishel | H04M 11/007 |
| | | | 315/287 |
| 6,894,609 B2 | 5/2005 | Menard et al. | |
| 6,933,686 B1 | 8/2005 | Bishel | |
| 7,273,983 B1 | 9/2007 | Rintz | |
| 7,761,555 B1* | 7/2010 | Bishel | H04L 67/06 |
| | | | 709/224 |
| 7,863,777 B2 | 1/2011 | Tsui et al. | |
| 8,175,533 B2 | 5/2012 | Schubert | |
| 8,531,310 B2 | 9/2013 | Cutler | |
| 10,404,045 B2 | 9/2019 | Smith et al. | |
| 2012/0262006 A1* | 10/2012 | Elberbaum | H02G 3/12 |
| | | | 307/112 |

FOREIGN PATENT DOCUMENTS

| | | |
|---|---|---|
| EP | 2058829 B1 | 5/2009 |
| EP | 3110006 B1 | 12/2016 |

* cited by examiner

*Primary Examiner* — Toan T Vu

(57) ABSTRACT

An apparatus that physically and electrically attaches to an existing AC electrical switch, and controls the power to the electrical load via outputs from the existing electrical switch or from wireless commands from a remote controller.

17 Claims, 13 Drawing Sheets

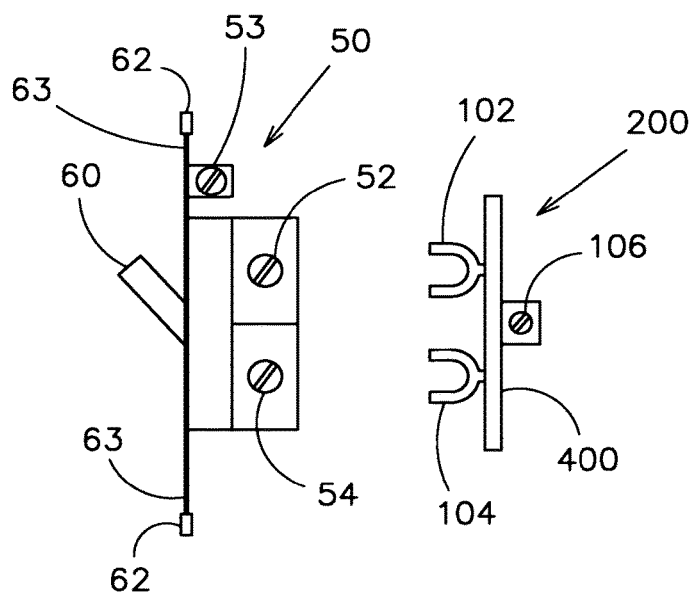
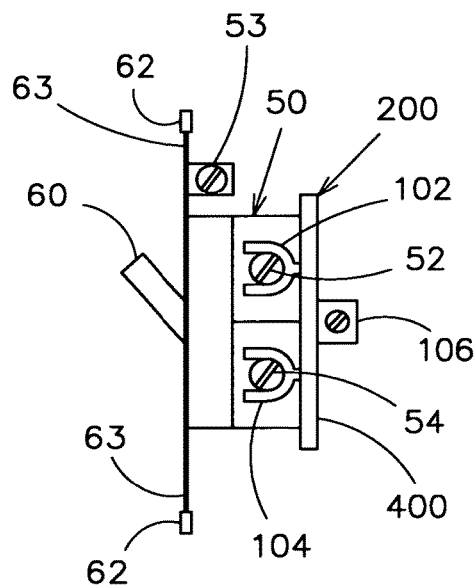
FIG. 3A    FIG. 3B
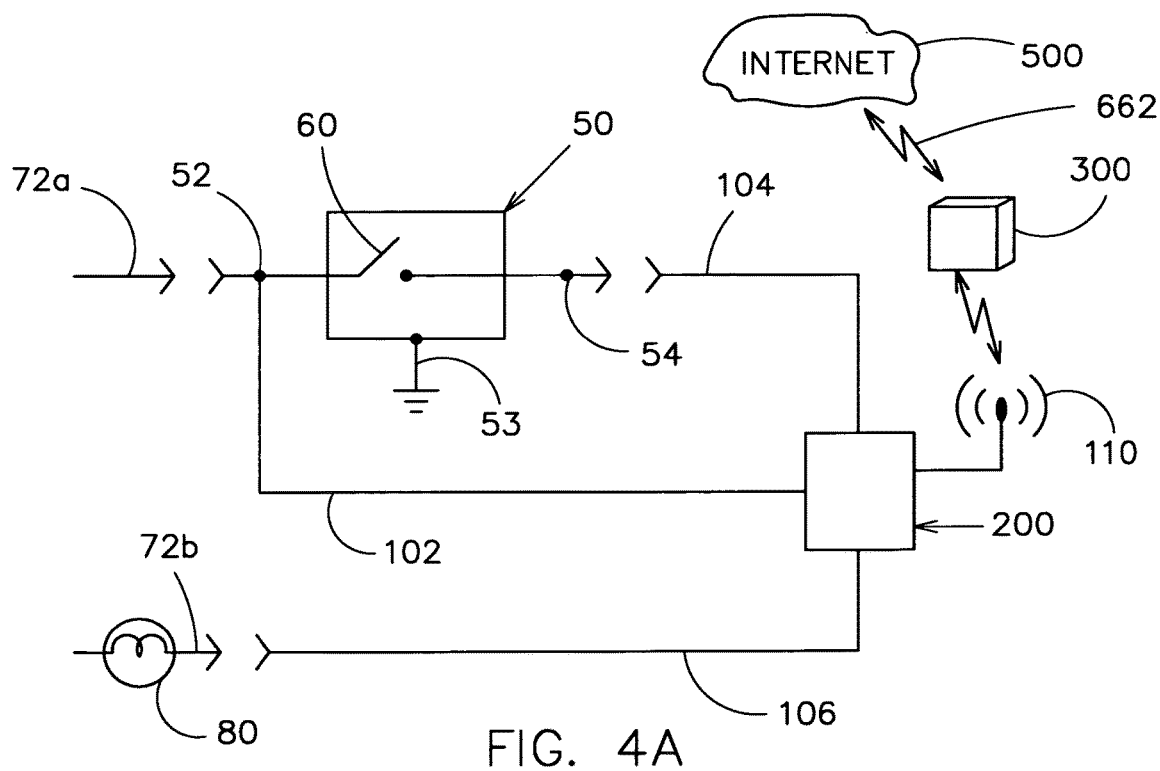
FIG. 4A

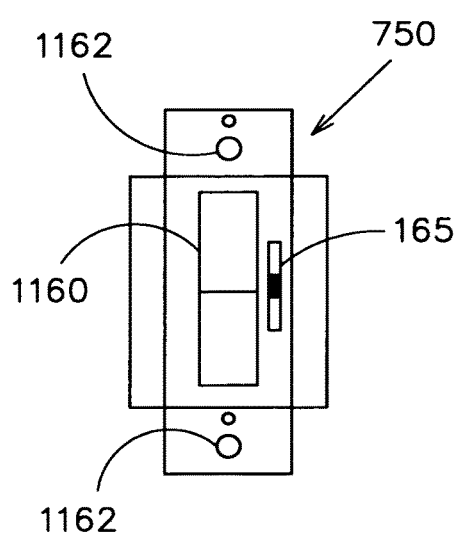
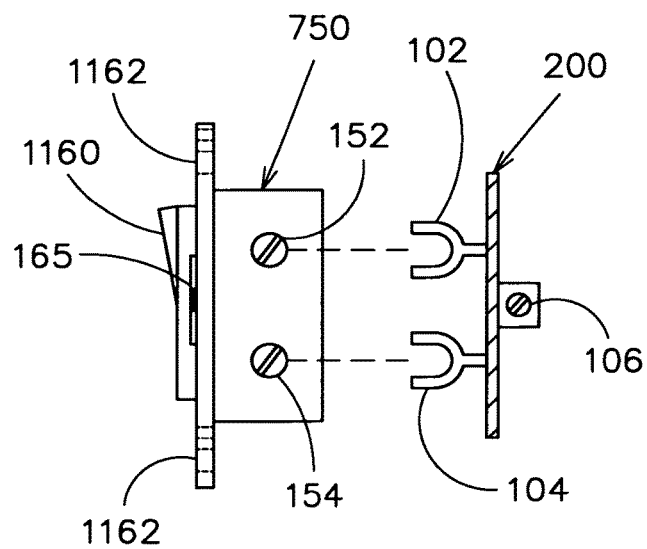
FIG. 12A  FIG. 12B
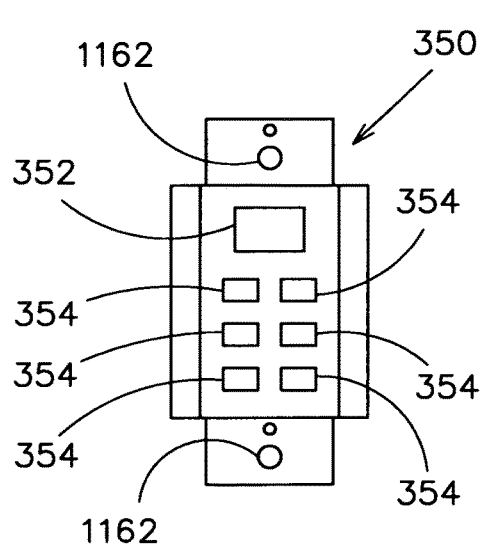
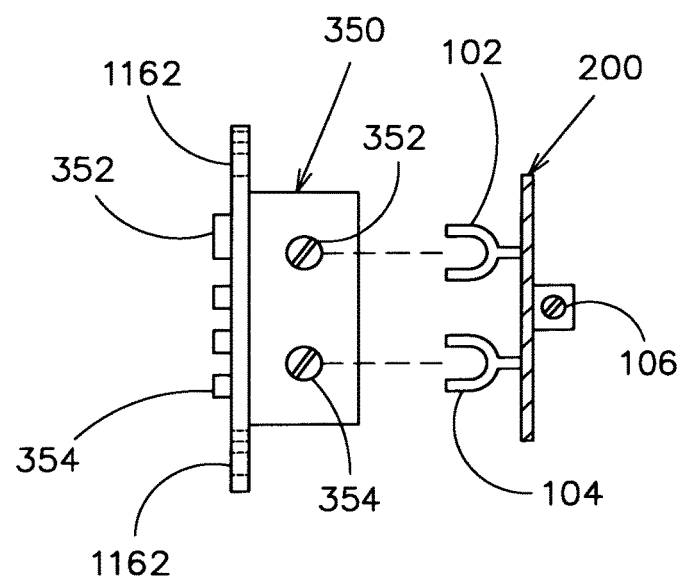
FIG. 13A  FIG. 13B

HOME AUTOMATION APPARATUS

RELATED APPLICATIONS

This application claims the benefit of the provisional patent application No. 62/753,690 filed on Oct. 31, 2018, which is hereby incorporated by reference herein in its entirety.

TECHNICAL FIELD

This disclosure relates home and commercial automation of electrical lighting and electrical loads, and more particularly to wireless modules that monitor existing electrical switches and control existing electrical loads.

BACKGROUND INFORMATION

Currently, there are many home automation switches with various wireless protocols that replace the existing electrical switches. These home automation switches provide many functions and allows for remote control. One could be in the same room or building and be able to change the electrical light to ON, OFF, or DIM. In addition, there are many other functions that can be programmed into the switch or handheld control device. However, each of these switches requires its own faceplate and a unique switch handle or buttons. Some of these handles are momentary and some of the switches have multiple inputs for selecting different functions. So the customer needs to replace the existing switch, the switch faceplate to match, and learn a new method to manually turn ON or OFF the light.
So, the disadvantages to the home automation switches are as follows:
1) The switch panel or faceplate needs to be replaced. The cost factor and the need to match color scheme are the concerns.
2) The regular existing switch, e.g. switch or special function switch, is replaced with a more complex switch panel. The user of the home automation switch needs to learn how interact with the new complex switch panel, and furthermore, any guest will also need to learn how to turn on the light.
3) The cost of the existing single-pole switch is usually around $0.50 or less. However, the home automation switch cost around 100 times more or around $50.00. This is a significant cost factor.

SUMMARY OF THE DISCLOSURE

The disclosure relates to an apparatus that physically and electrically attaches to an existing AC electrical switch in an electrical box, and controls the power to the electrical load via outputs from the existing electrical switch or from wireless commands from a remote controller. The existing electrical switch can be single-pole switch, double-pole switches, rocker style switches, three-way switches, four-way switches. In addition, the existing electrical switch can have timing functions, dimmer functions, or motion detection features. Attaching the apparatus to existing electrical switch has several advantages over current home automation devices besides the previous described deficiencies: compact size compared to external modules, reduce wiring, and reduce cost.

In one embodiment, the apparatus physically attaches to an existing electrical switch via terminals and electrically connects to the electrical switch via the same terminals. The apparatus is connected to the electrical load using a relay mounted on the apparatus coupled between current leads for controlling the flow of a current to the electrical load and a wireless controller mounted on the apparatus. The wireless controller is configured to enable the relay and receive commands over a wireless connection or/and from the existing electrical switch.

In another embodiment, the apparatus selectively energizes an electrical load using a relay mounted on the apparatus coupled between current leads, from the electrical AC supply to the electrical load, for controlling the flow of a current to the electrical load. The apparatus physically attaches to an electrical switch via push-in terminals and electrically connects to said electrical switch via same push-in terminals. A wireless controller mounted on the apparatus is configured to enable the relay from receiving commands over a wireless connection or from output of the electrical switch via the electrical connection to switch.

In another embodiment, an apparatus selectively energizes an AC electrical load using a thyristor mounted on the apparatus coupled between current leads for controlling the flow of a current from said AC electrical power supply to said AC electrical load. The apparatus is electrically connected to an electrical switch, an AC electrical power supply, and said AC electrical load. The apparatus is affixed to the electrical switch by screw terminals of the switch, by the push-in terminals of the switch, by fastening the apparatus with physical fasteners such as screws or spring clamps, by gluing the apparatus to the switch, or a combination of these attaching methods. A power converter is coupled between an AC electrical power supply and an AC electrical load and the power converter effected for converting a small portion of the AC current at the beginning of each half or full AC cycle which appears across the thyristor in each ON and OFF states thereof the source of the DC power supply for the apparatus. A wireless controller mounted on the apparatus configured to enable the thyristor by receiving commands over a wireless connection or from the inputs of an electrical switch.

BRIEF DESCRIPTION OF DRAWINGS

FIG. 3A is a side view of the electrical switch and one embodiment of the apparatus separated.
FIG. 3B is a side view of the electrical switch and one embodiment of the apparatus physically and electrically attached together.
FIG. 4A is an isometric view of the electrical switch and apparatus installation in an electrical box.

FIG. 12A is a front view of the dimmer switch.

FIG. 12B is a side view of the dimmer switch and an embodiment of apparatus.

FIG. 13A is a front view of a timer switch.

FIG. 13B is a side view of the timer switch and an embodiment of the apparatus.

DETAILED DESCRIPTION OF EMBODIMENTS

Figure 1A:
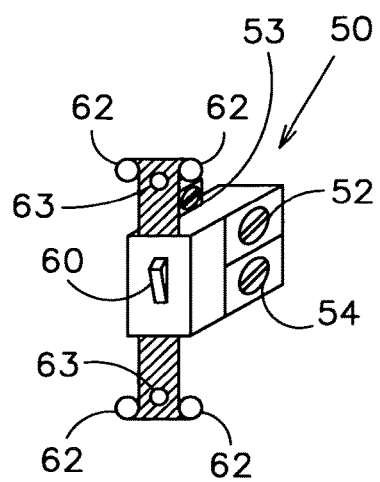
FIG. 1A is an isometric view of an existing electrical switch.

FIG. 1A shows an isometric view of a typical household or commercial building AC electrical switch 50 which is installed in home and commercial buildings to control lights, fans, and other electrical loads. The switch 50 has a handle 60 which controls the position of the switch 50. The handle 60 position connects or disconnects the supply power to the electrical load. The switch 50 is typically mounted in an electrical box shown in FIG. 2B with the mounting flanges 62 and mounting holes 63. The switch 50 contains screw terminals 52 and 54 to connect to the electrical power supply and to the electrical load. A ground terminal 53 or a ground wire are included on the electrical switches.

Figure 1B:
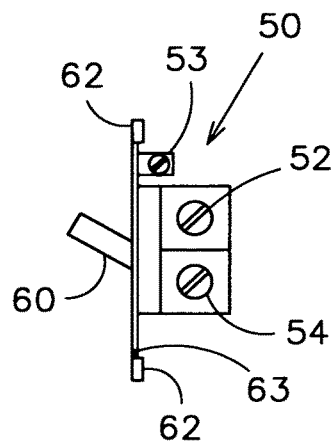
FIG. 1B is a side view of an existing electrical switch.
Figure 1C:
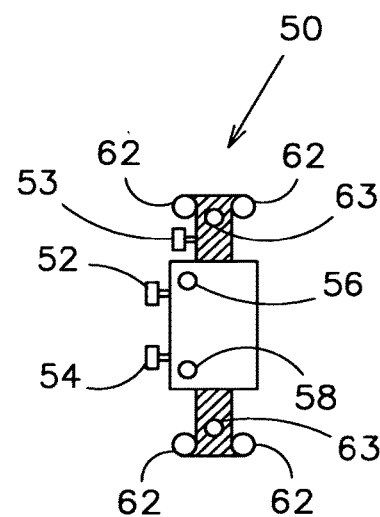
FIG. 1C is a back view of an existing electrical switch.

FIGS. 1B and 1C shows the side and bottom/back view, respectively, of the same switch 50. In the back view, there are terminals 56 and 58 to insert the electrical wires which are connected to the screw terminals 52 and 54, respectively. These push-in wire terminals 56 & 58 are for push-in wire connections, designed so that you can insert wires simply by pushing a bare end of the wire into the opening, where a spring clamp holds the wire. So, the AC electrical power supply can be attached to the screw terminal 52 by wrapping the wire onto the screw terminal 52 and turning the screw terminal to tighten the screw against the wire, or via the push-in terminal 56 by pushing the wire into the opening. The electrical load is attached to the other screw terminal 54 or via the other push-in wire terminal 58. The wires to the AC power supply and electrical load can be reversed and attached to the opposite terminals or inserts and the same switch 50 will turn ON or OFF the circuit.

There are many different types of the ON/OFF electrical switches such as single-pole switch shown in the FIG. 1A, double-pole switches, rocker style switches, three-way switches, four-way switches that are installed in an electrical box. There are also multiple switches (rocker or standard style) that included in within same housing. All these types of switches have similar characteristics; switch handle or rocker style handle, mounting flanges and holes, screw terminals, and push-in wire terminals.

Figure 2A:
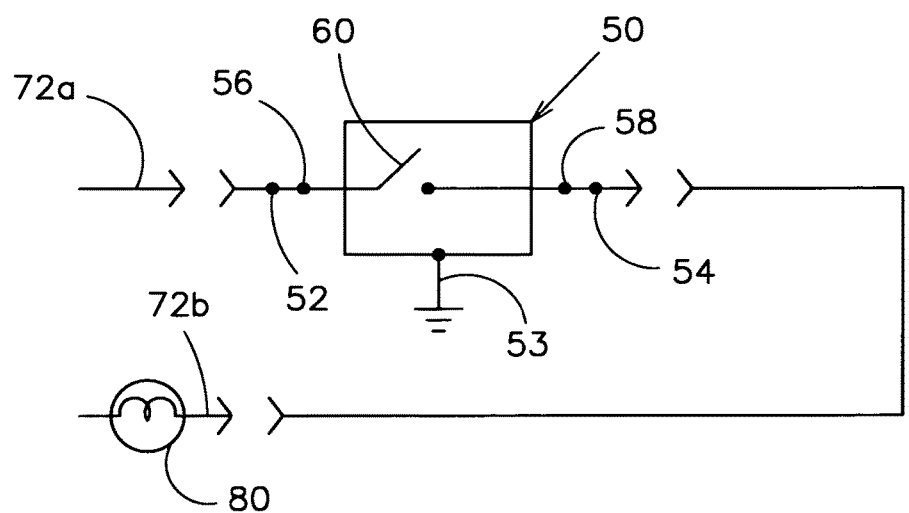
FIG. 2A is an isometric view of an existing electrical switch installation in an electrical box.
Figure 2B:
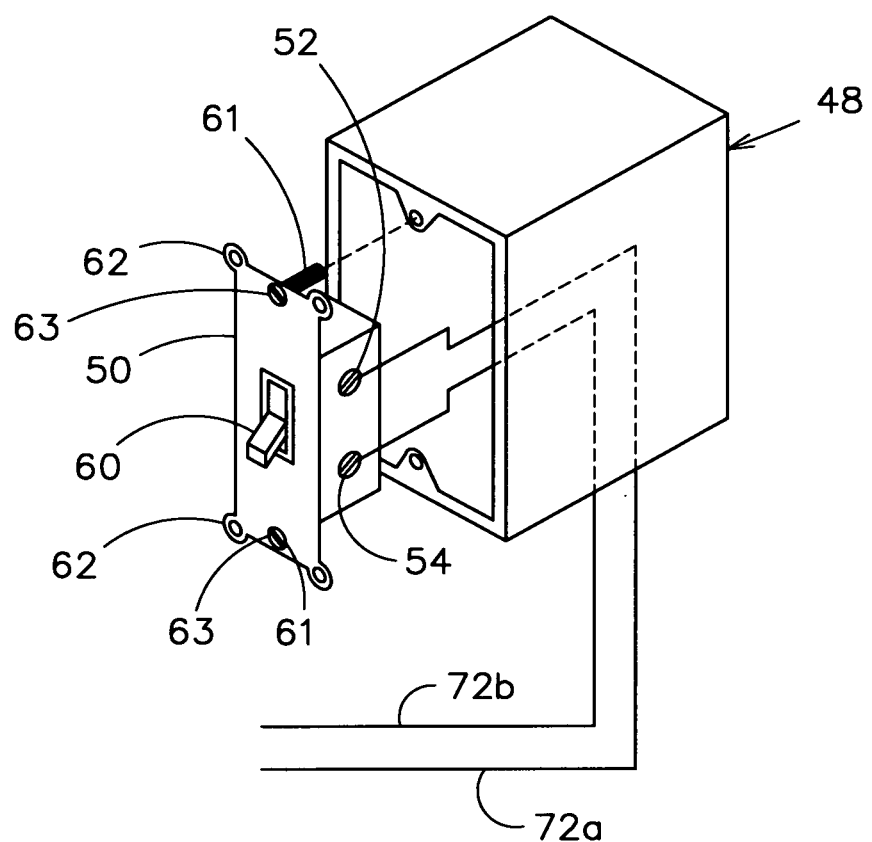
FIG. 2B is a block diagram of the installation wiring of the electrical switch.

FIG. 2A shows a wiring diagram of the installation of the electrical connections of the switch 50 to the AC electrical power supply, line 72a, via either the terminal screw 52 or the push-in wire terminal 56. The handle 60 is shown with the switch 50 as opened. The terminal screw 54 or push-in wire terminal 58 connects to the electrical load 80, an electric light, via wire 72b. FIG. 2B shows the installation of the switch 50 into an electrical box 48. Screw terminal 52 on the switch 50 is connected to the electrical power wire 72a and the screw terminal 54 is connected to the electrical load wire 72b. The electrical switch 50 is installed in the electrical box 48 with mounting screws 61 through the switch mounting holes 63 to the electrical box mounting holes. A faceplate (not shown) covers the electrical box 58 and electrical switch 50, and only exposes the electrical switch handle 60 for the user. The push-in wire terminals are not shown in FIG. 2B since these terminals are not used for this installation, but they could be attached for faster switch installation.

There also rocker style switches with similar mounting flanges and screw terminals. In addition, there similar style switches with timing functions, dimmer functions, and motion detection features built into the switch with similar mounting flanges/holes, screw terminals, and switch mechanism. Some of these feature switches e.g. dimmer, timer, and motion, also have the push-in wire terminals.

To overcome previous noted disadvantages and provide for the convenience of the home automation switch, a wireless apparatus 200 was conceived. The preferred embodiment is shown in FIGS. 3A-3B. The wireless apparatus 200 attaches to the existing electrical switch 50. As shown in FIGS. 3A-3B, the apparatus 200 contains a module board 400 that physically and electrically attaches via terminals 102 and 104 to the screw terminals 52 and 54, respectively, of the electrical switch 50. FIG. 3A shows the switch 50 and the wireless apparatus 200 separately and FIG. 3B shows the switch and the wireless apparatus physically together. The module board 400 contains the electronic components. A terminal is an electrical and physical connector which is electrically and/or physically attaches to the apparatus 200 at one end and can be attached to an electrical switch 50 at the other end, acting as the reusable interface. A terminal is can be an end of a wire connector or a fastener such as fork terminal, pin terminal, hook terminal, ring terminal, spade terminal, PCB terminal, a plug terminal, screw terminal, and blade terminal. The terminal may be physically attached to the wireless apparatus 200 e.g. soldered to the module board 400 or via a wire connection.

Figure 4B:
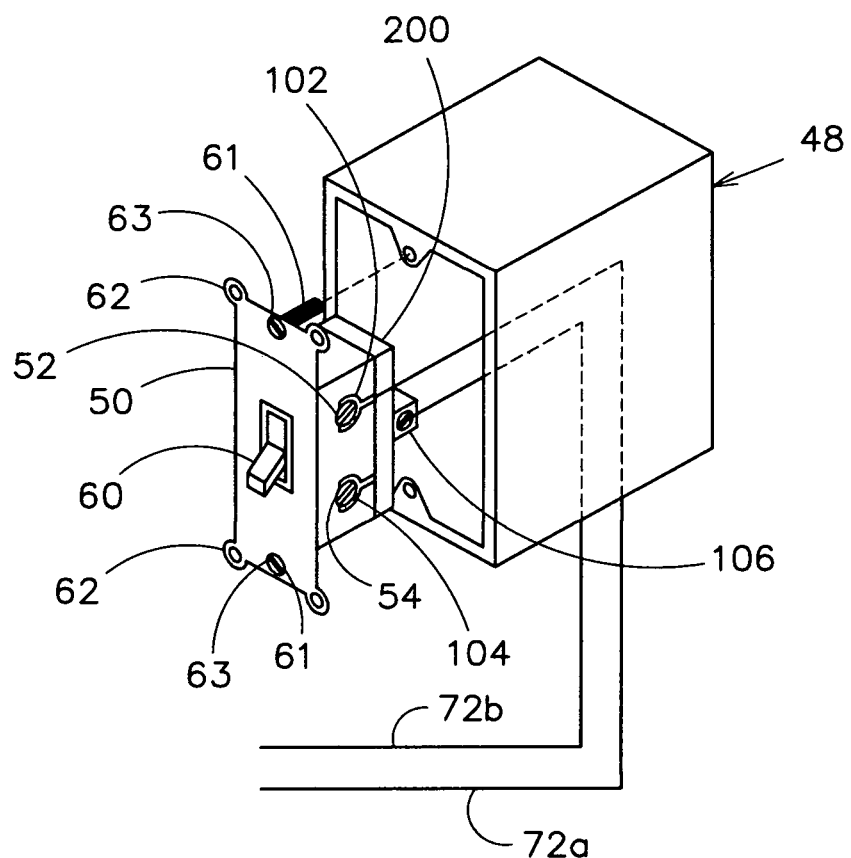
FIG. 4B is a block diagram of the installation wiring of the electrical switch with one embodiment of the apparatus with wireless connections shown.

FIG. 4A shows an electrical block diagram of the switch 50 connected to the wireless apparatus 200 via terminals 102 and 104. The AC power supply 72a is connected to the switch 50 via screw terminal 52 and to the wireless apparatus 200 via terminal 102. The switch 50 position is read by the wireless apparatus 200 via the connection of the screw terminal 54 and terminal 104. This allows the apparatus 200 to read the switch state whether the switch 50 is opened or closed. If the switch changes states, the apparatus 200 will turn the light ON or OFF depending on the current light status. The power to the electrical load 80 via wire 72b is through the wireless apparatus 200 from the screw terminal 106. The handheld or mounted device 300 can control the power to the electrical load 80 via the wireless commands 110. The handheld or mounted device 300 can be connected to the Internet 500 via a wired or wireless connection, and the electrical load 80 can be controlled from a distance. The screw terminal 53 on the switch 50 shown in FIGS. 3A and 3B is attached to ground shown in FIG. 4A. FIG. 4B shows the installation of the switch 50 with the attached wireless apparatus 200 into an electrical box 48. Screw terminal 52 on the switch 50 is connected to the electrical power wire 72a and the screw terminal 106 is connected to the electrical load wire 72b. The screw terminal 54 is attached to the terminal 104. The electrical switch 50 is installed in the electrical box 48 with mounting screws 61 through the mounting holes 63 to the electrical box mounting holes. A faceplate (not shown) covers the electrical box 58 and electrical switch 50, and only exposes the electrical switch handle 60 for the user. No new faceplate is needed nor any significant wiring changes. Only the electrical load wire 72b is attached to terminal 106 instead of the screw terminal 54. For clarity, the ground wire connection is not shown in this figure, but the ground wire is typically installed in almost all electrical installations.

Figure 5:
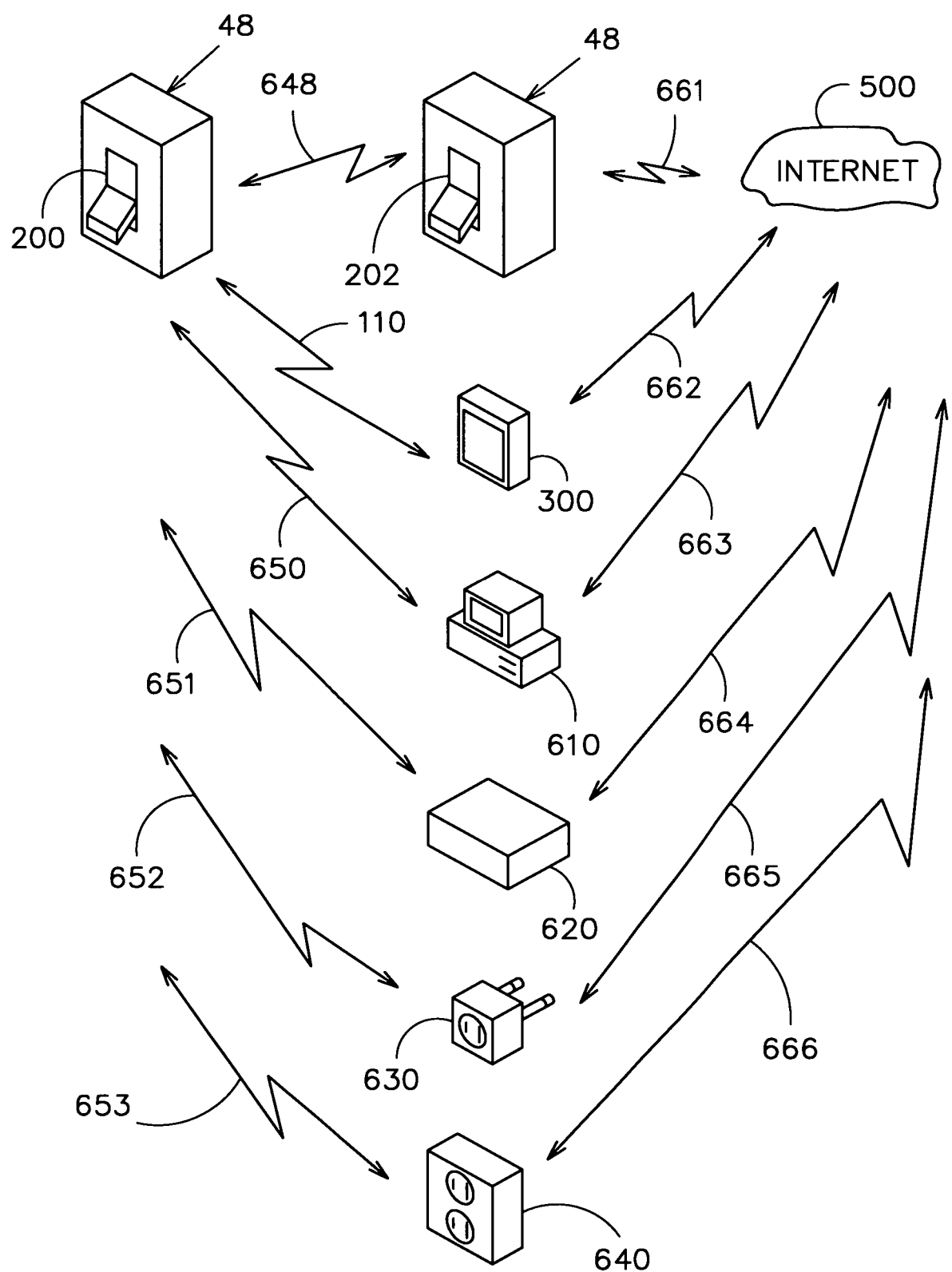
FIG. 5 is an isometric view of remote controllers, wired or wireless routers, and wireless connections.

The smart device 300 shown in FIG. 4A and FIG. 5 can be a handheld smart phone or laptop/tablet computer such as an Android phone, Android tablet or laptop computer, an Apple iPhone, iPad, Windows handheld or laptop computer, a Linux handheld or laptop computer, or any other handheld computer devices with wireless capability to the apparatus 200 and to communicate to the Internet 500 via a wireless capability 662. Shown in FIG. 5, the smart device 300 can also be desktop computer 610 such as Windows PC, Linux PC, Apple MAC PC, or similar computer with wired or wireless capabilities 663 to Internet 500 and wireless capabilities 650 to the apparatus 200. The smart device 300 can also be a router 620, a plug-in electrical automation module 630, another device 640 in wireless mesh network, or a second apparatus 202 connected to the Internet 500 via the wireless capabilities 664-666, and 661 respectively. The router 620, plug-in electrical module 630, another device 640, and second apparatus 202 are wirelessly communicate to the apparatus 200 via wireless capabilities 651-653, and 648, respectively. In addition, the apparatuses 200 or 202 may connect directly to the Internet 500 without any device 300 interface. The wireless protocols in apparatus 200 & 202 can be Bluetooth™, Wi-Fi, Wi-Fi direct, Zigbee™, Thread™, Z-Wave™, Insteon™, proprietary, or multi-protocols.

Figure 6A:
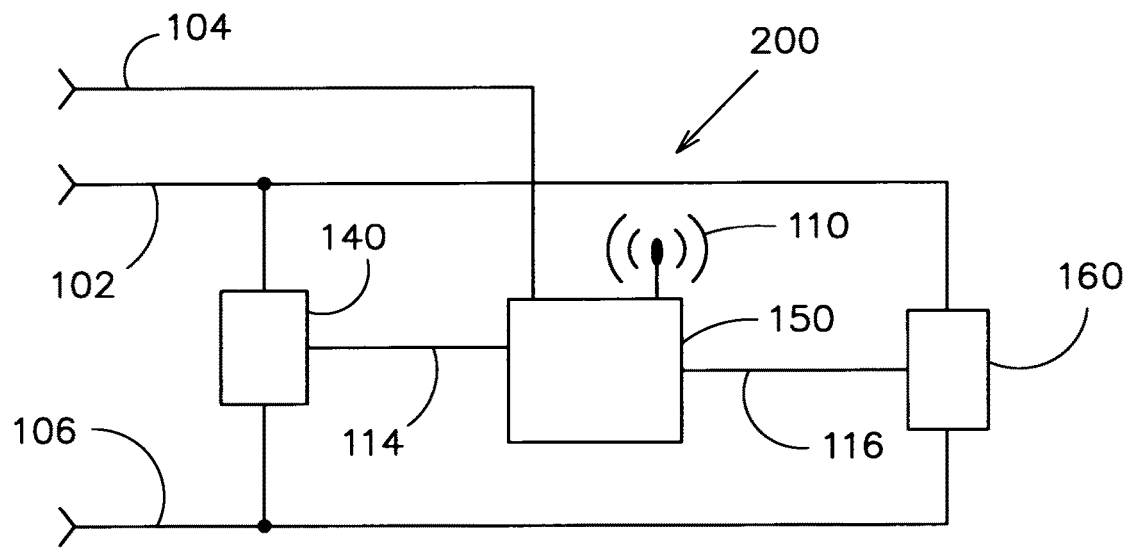
FIG. 6A is a block diagram of one embodiment of the apparatus.

FIG. 6A show the block diagram of the wireless apparatus 200. The wireless apparatus 200 consist of the power converter 140, a wireless controller 150, and relay 160 mounted on the module board. The wireless controller 150 has the capability to also do control functions. The power converter 140 supplies power to the wireless controller 150 via line's 114. The wireless controller 150 controls the relay 160 via line 116. The switch 50 status is read via terminal 104 into the wireless controller 150. The zero crossing of the AC power cycle is read via terminal 103 into the wireless controller 150. The wireless controller 150 reads the switch state and receives wireless commands 110 from a remote controller. From this information, the wireless controller 150 controls via line 116 the relay 160. The relay 160 is connected between the AC power supply on line 102 to the to an electrical load on line 106. The relay 160 can be a thyristor or a mechanical relay. The thyristor can be a SCR, Silicon Controlled Rectifier, or a TRIAC, TRIode AC switches.

Figure 6B:
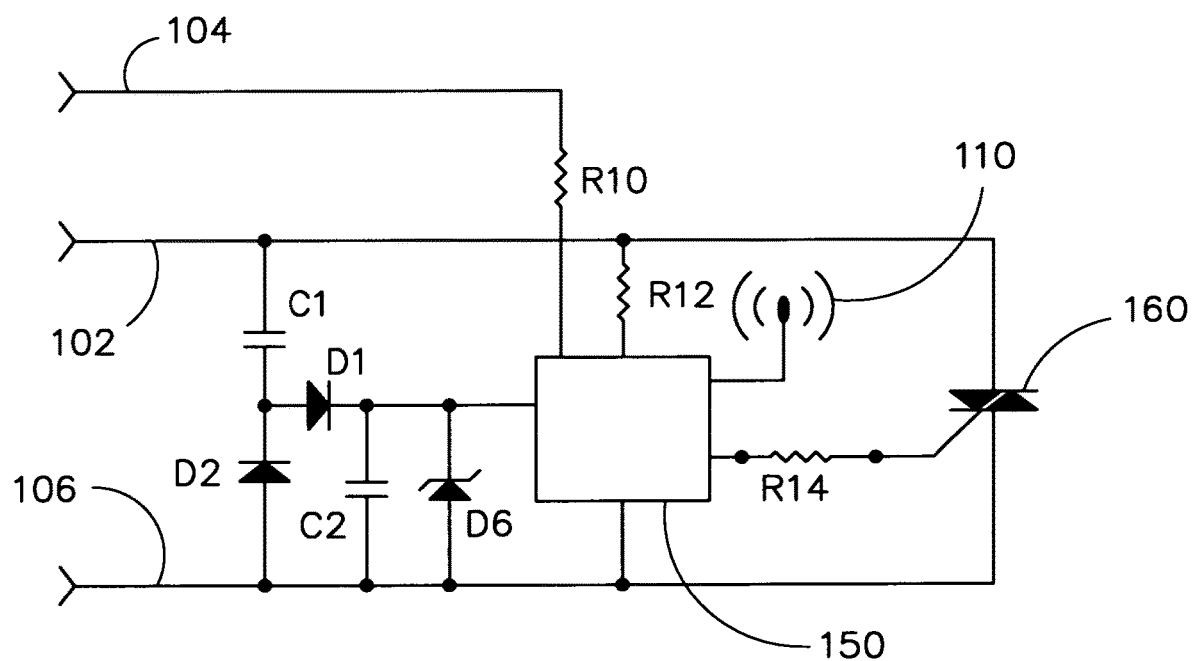
FIG. 6b is a wiring diagram of one embodiment of the apparatus.

FIG. 6B shows the electrical schematic of the wireless apparatus 200. The wireless controller 150 can be a Texas Instruments CC2650 integrated circuit, a Nordic nRF51822, Silicon Labs EFR32BG, or any of the commercial wireless modules. The wireless protocols can be Bluetooth™, Wi-Fi, Wi-Fi direct, Zigbee™, Thread™, Z-Wave™, Insteon™, proprietary, or multi-protocols. FIG. 6B shows the power converter 140 which consist of "cycle-stealing" circuitry patented by the author in U.S. Pat. Nos. 6,356,038B2, 5,872,832A, and 6,933,686B1 which are incorporated in their entirety into this application. The AC power supply voltage in line 102 is dropped across the capacitor C1 and is rectified by diodes D1 and D2 (half-wave rectification). The capacitor C2 stores the electrical energy and diode D6 limits the voltage of the circuit. While the relay 160 is in the "OFF" state, the capacitor is fully charged and supplies power to the wireless controller 150. When the relay 160 is in "ON" state, the capacitor C2 is charged up on the beginning of the AC cycle and the wireless controller 150 turns on the relay 160 via a pulse through resistor R14. After the relay 160 is in "ON" state, the capacitor C2 has enough energy to continue to supply power to the wireless controller 150 for the remainder of the AC cycle. This technique, which steals a portion of the power every partial cycle is noted as "cycle-stealing", is fully described in the noted reference U.S. patents. There are many different types of circuits to accomplished the same "cycle-stealing" function and provide power to the wireless module and the electrical load on the same AC cycle. Many of these circuits are described in full detail in the noted patents by the author. Relay 160 can be TRIACs, SCRs, or relays. In this embodiment, resistor R14 is use to trigger the gate of the triac 160 from the wireless controller 150. Other interfaces for the controlling the triac 160 from the wireless controller 150 can be used and is noted in the prior art patents. Resistor R10 provides the input from the switch 50 via terminal 104 to the wireless controller 150. Resistor R10 drops the voltage to a much lower value and the internal diodes in the wireless controller 150 limits the voltage. Resistor R12 drops the voltage similarly as R10, but the resistor R12 is tied to power line 102. The wireless controller 150 reads the input from resistor R12 and denotes when the AC cycle is crossing zero.

Figure 7A:
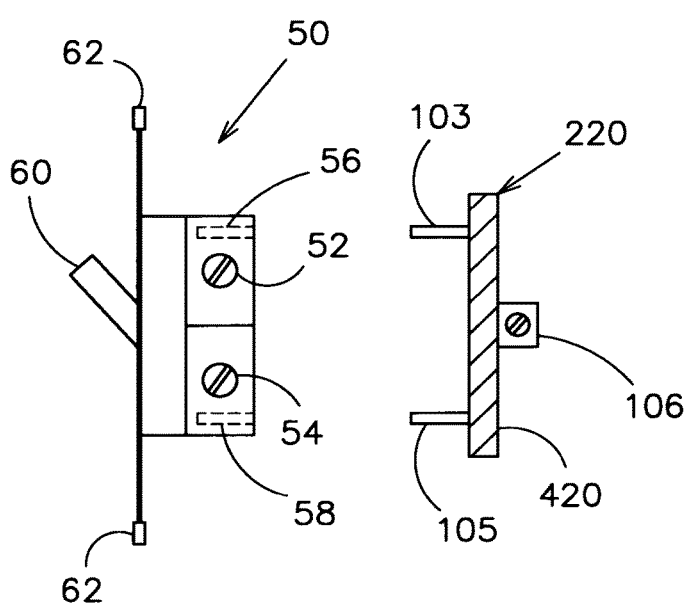
FIG. 7A is a side view of the electrical switch and another embodiment of the apparatus separated.
Figure 7B:
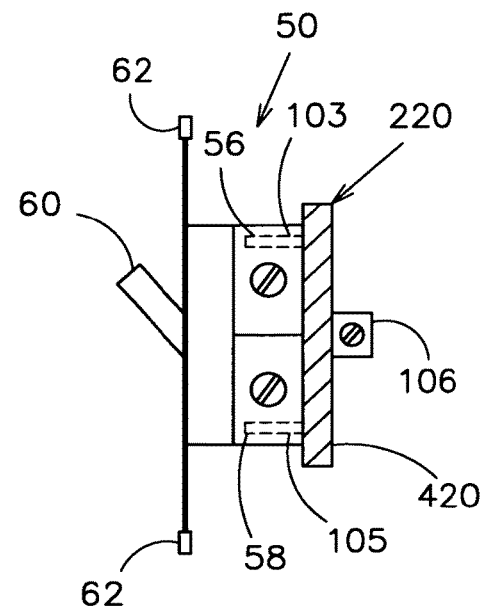
FIG. 7B is a side view of the electrical switch and another embodiment of the apparatus physically and electrically attached together.

FIG. 7A shows another embodiment of the wireless apparatus 220. FIGS. 7A-7B show a different physical attachment of the wireless apparatus to the switch 50. Shown in both FIG. 7A and FIG. 7B, the wireless apparatus 220 contains pin terminals 103 and 105 that plug into the back of the switch 50 via terminals 56 and 58. Majority of electrical switches have two ways to attach the wires: 1) from the side screw terminals and 2) from friction hold plug-in holes in the back of the switch. The pin terminals 103 and 105 on the wireless apparatus 220 plugs into the terminals 56 and 58, respectively, and provide both an electrical and mechanical connection to the switch 50. The terminal 106 from the wireless apparatus 220 connects to the electrical load. The wireless module 220 consist of the circuit board 420 with the components, pin terminals 103 & 105, and terminal 106. FIG. 7A shows the two units separately, switch 50 and wireless apparatus 220. FIG. 7B shows the completed system with the pin terminals 103 and 105 physically plug into terminals 56 and 58. The combination provides both an electrical connection to the switch 50 and a mechanical connection to the switch 50. Once plug in, the friction fit from the spring-loaded holes in the switch 50 will hold the pin terminals 103 and 105 in place and provide a physically attachment and electrical connection to the circuit board 420.

Figure 8:
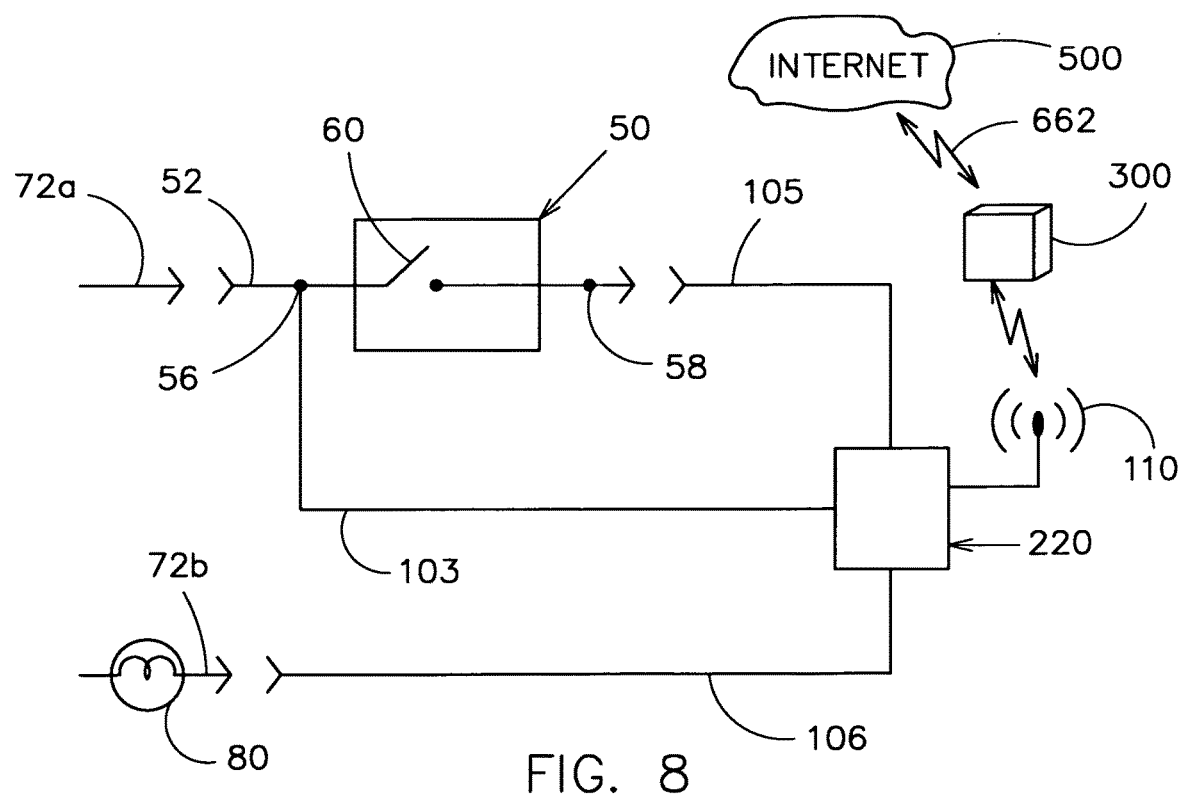
FIG. 8 is a block diagram of the installation wiring of the electrical switch with another embodiment of the apparatus with wireless connections shown.

FIG. 8 show the electrical connection between the line voltage 72a, the switch 50, the wireless apparatus 220, and the electrical load 80. The switch 50 plug-in terminal 56 accepts pin terminal 103 which is electrically connected to the apparatus 220. The power supply line 72a connects to the wire terminal 52 of the switch 50 and via plug-in terminal 56 electrically connects to pin terminal 103 which supplies power to the wireless apparatus 220. The switch 50 also connects via plug-in hole 58 to the wireless apparatus 220 via pin terminal 105 to provide the status of the switch position to the wireless apparatus 220. The connection to the electrical load 80 from the wireless apparatus 220 via line 106 connected to the wire 72b. The wireless apparatus 220 transmits and receives commands 110 from a device 300. The installation is the electrical box is similar to the previous embodiment as shown in FIG. 4B.

Figure 9A:
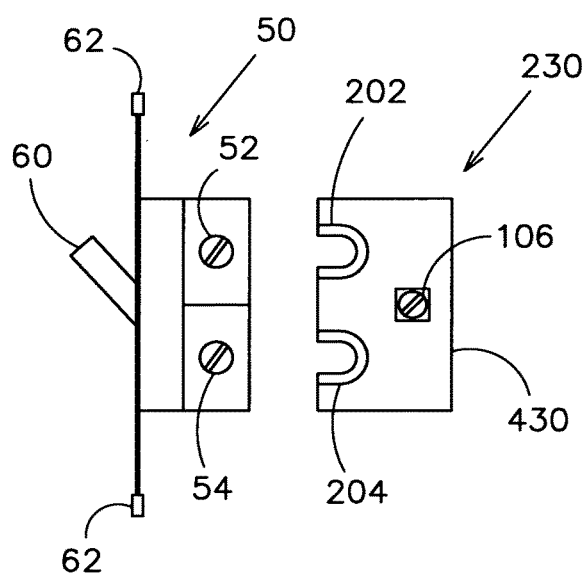
FIG. 9A is a side view of the electrical switch and another embodiment of the apparatus separated.
Figure 9B:
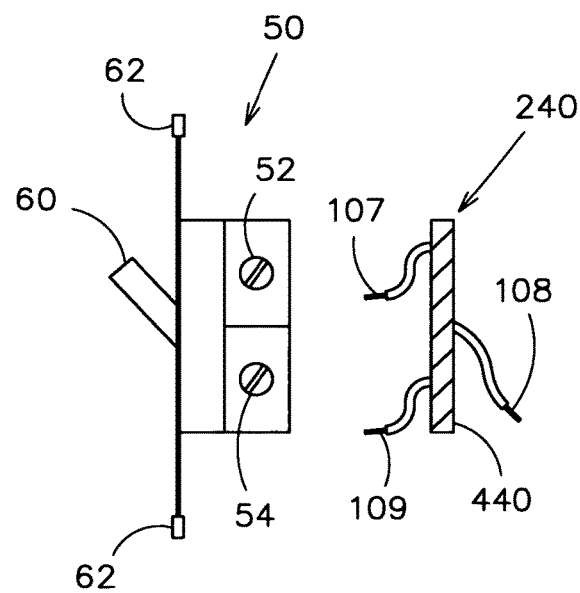
FIG. 9B is a side view of the electrical switch and another embodiment of the apparatus separated.
Figure 9C:
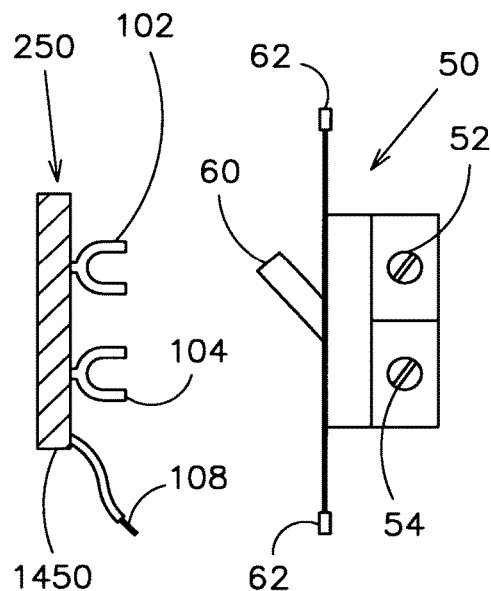
FIG. 9C is a side view of the electrical switch and another embodiment of the apparatus separated.
Figure 9D:
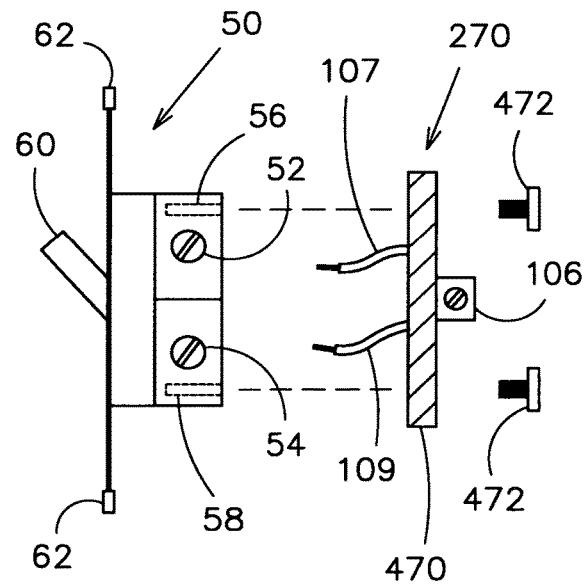
FIG. 9D is a side view of the electrical switch and another embodiment of the apparatus separated.
Figure 9E:
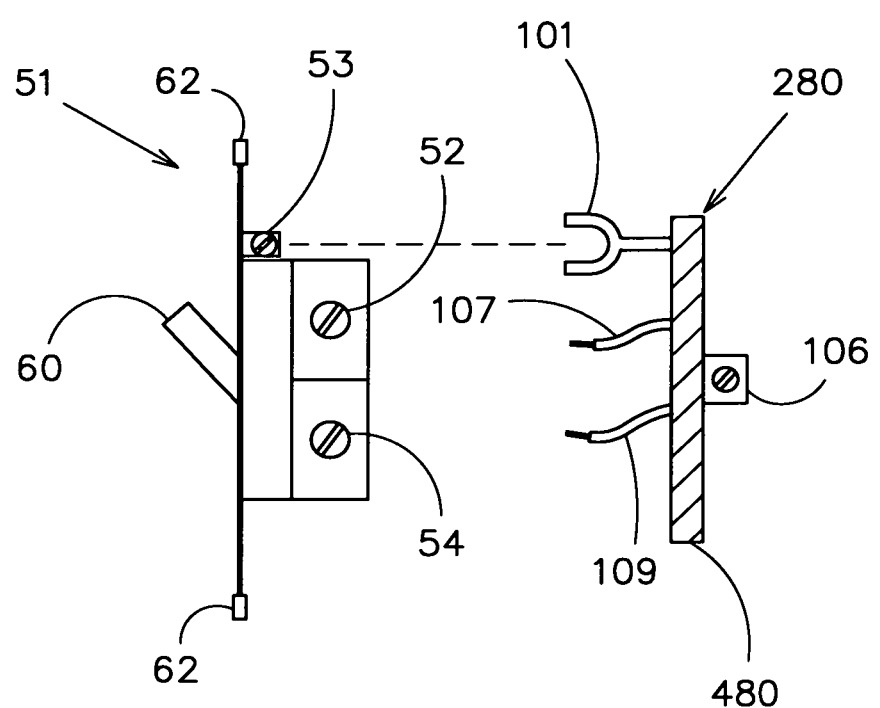
FIG. 9E is a side view of the electrical switch and another embodiment of the apparatus separated.

FIGS. 9A, 9B, 9C, 9D and 9E shows additional embodiments with various attachment schemes. FIG. 9A shows the wireless apparatus 230 as a printed circuit board module 430 that attaches to the wire terminals 52 and 54 of the switch 50 via pads 202 and 204, respectively, on the board. The pads 202 and 204 are similar to the terminals 102 and 104 as in FIGS. 3A and 3B. Terminal 106 is the connection to the electrical load. FIG. 9B shows another embodiment of the wireless apparatus 240 consisting of a module 440 with components and wires 107, 108, and 109. Wires 107 and 109, are similar to the pad connections in FIG. 9A and attaches to the screw terminals 52 and 54, respectively, of the switch 50. The wire output 108 goes to the electrical load. In this embodiment, the module 440 is glued to the back of the switch. FIG. 9C shows another embodiment of the wireless apparatus 250 that attaches to the front of the switch 50. The wireless apparatus 250 consist of a module 1450, terminals 102 & 104, and wire 108. Terminals 102 and 104 of the wireless apparatus 250 attaches to the screw terminals 52 and 54, respectively, of the switch 50. The wire 108 attaches to the electrical load. FIG. 9D shows another embodiment where the attachment to the switch 50 by the apparatus 270 is via fasteners 472 and the apparatus 270 uses wires 107 and 109, respectively, to connect to the screw terminals 52 and 54. The electrical load connected to screw terminal 106. The AC power supply is supplied via screw terminal 52 on the switch 50 to the circuit board 470 via wire 107. FIG. 9E shows another embodiment where the attachment to the switch 50 by the apparatus 280 is via terminal 101 to the ground terminal 53, and the apparatus uses wires 107 and 109, respectively, to connect to the screw terminals 52 and 54. The electrical load connected to screw terminal 106. The power supply is supplied via screw terminal 52 on the switch 50 to the circuit board 480 via wire 107. There can be many different variations of pin terminals, fork terminals, printed board slots, fasteners, wires, spring-loaded terminals, spring-loaded attachment mechanism, or combination of different types to provide both the physical and electrical connection to the switch e.g. as a pin terminal for physically attachment and wires for electrically connection.

Figure 10:
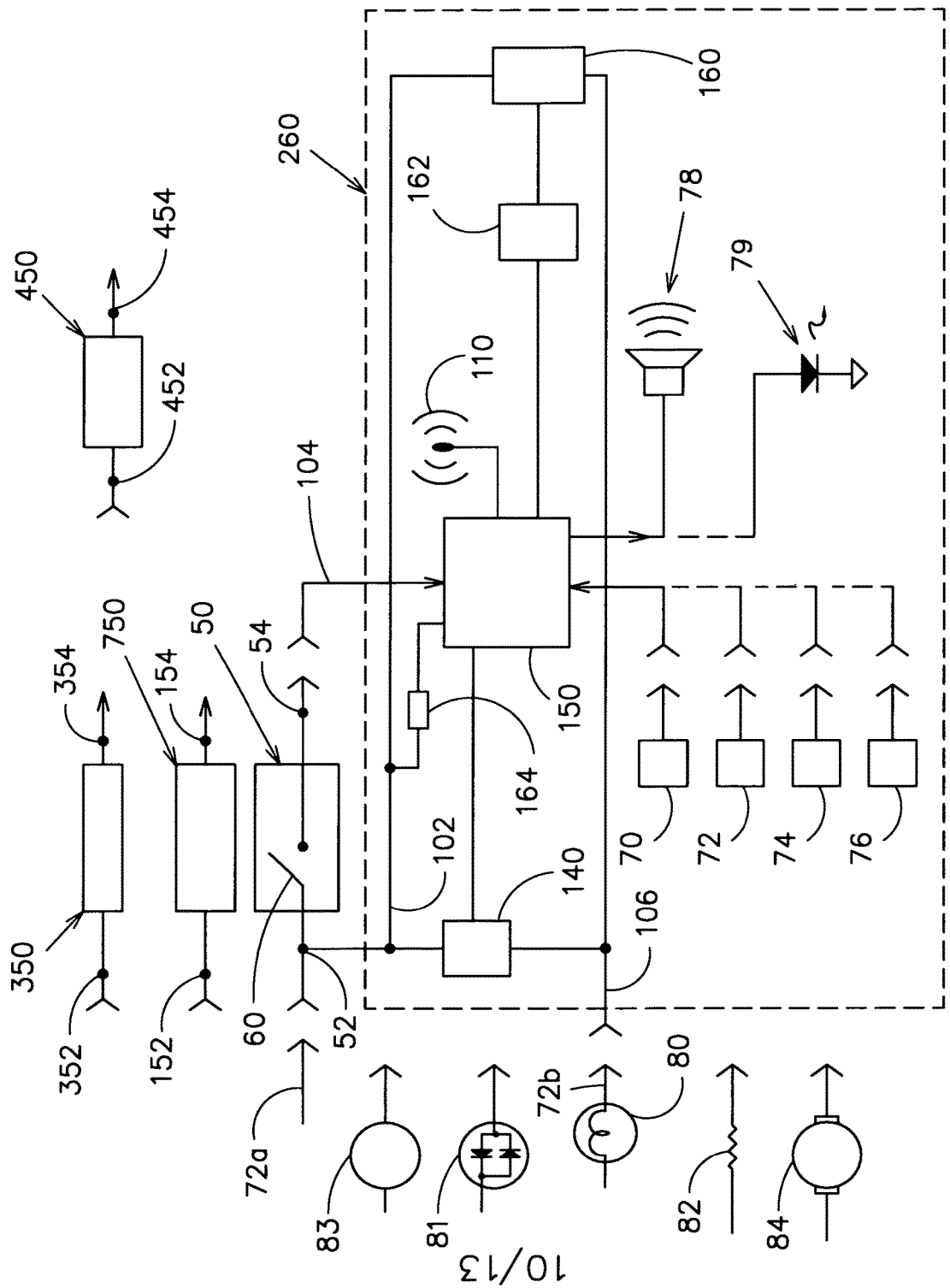
FIG. 10 is a block diagram of one embodiment of the apparatus shown with different electrical switches, electrical loads, sensors, and visible or audio outputs.

FIG. 10 shows block diagram of different combinations using the switch 50, the dimmer 750, a timer 350, or motion sensor 450 connecting to the wireless apparatus 260, to many other sensors, outputs, and electrical loads. The sensors may be motion 70, temperature 72, burglar switch 74, smoke detector 76, and many others. The outputs from the wireless controller 150 can be a speaker 78 or a LED light 79. The electrical load may be an incandescent 80, LED light 81, or compact fluorescent light 83, a heater 82, or a motor 84. FIG. 10 also shows the zero-crossing detector 164, the power converter 140, the relay driver 162, and the relay 160.

Figure 11:
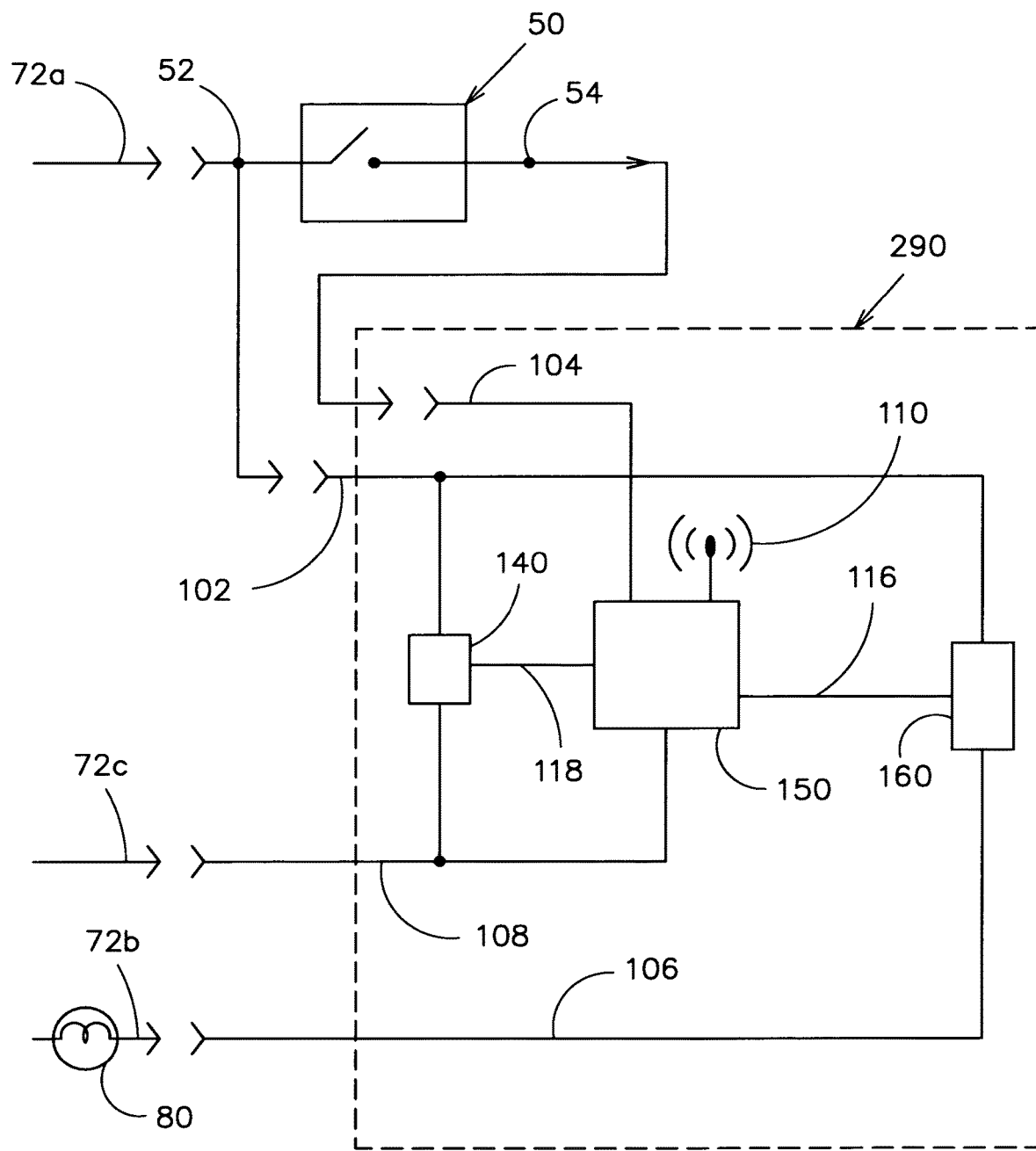
FIG. 11 is a block diagram of another embodiment of the apparatus with different powering scheme.

Another embodiment 290 shown in FIG. 11 would be to use the neutral or ground wire 72c to provide the connection to the power supply network 140 via line 108. In this embodiment, the power is continuously available to the power supply network 140 whether the relay is in the "ON" state or "OFF" state, and there no need to rely on charging or discharging a capacitor to provide the power or designing the circuitry to be very low power consumption. The switch 50 status is read via terminal 104 to the wireless controller 150. The line power via 72a to line 102 provides the power to the power converter 140. The return line for powering the circuitry is via line 108 to the neutral or ground wire 72c. The relay 160 controls the power to the electrical load via line 106 to wire 72b of the electrical load 80. The wireless module is power from the line's 118 and provides the drive signal 116 to the control the relay 160. In this embodiment, one can connect line 108 via wire 72c to wire 72b going to the electrical load 80 and then the embodiment would operate similarly as initially disclosed embodiment 200.

Figure 14A:
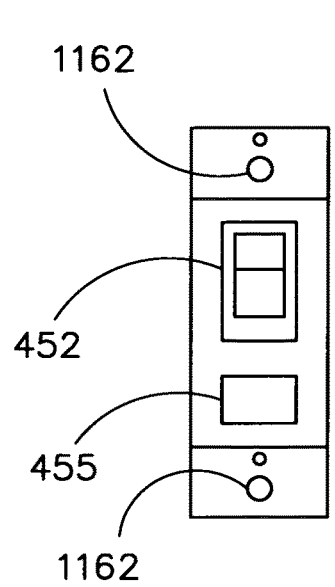
FIG. 14A is a front view of the motion switch and an embodiment of the apparatus.
Figure 14B:
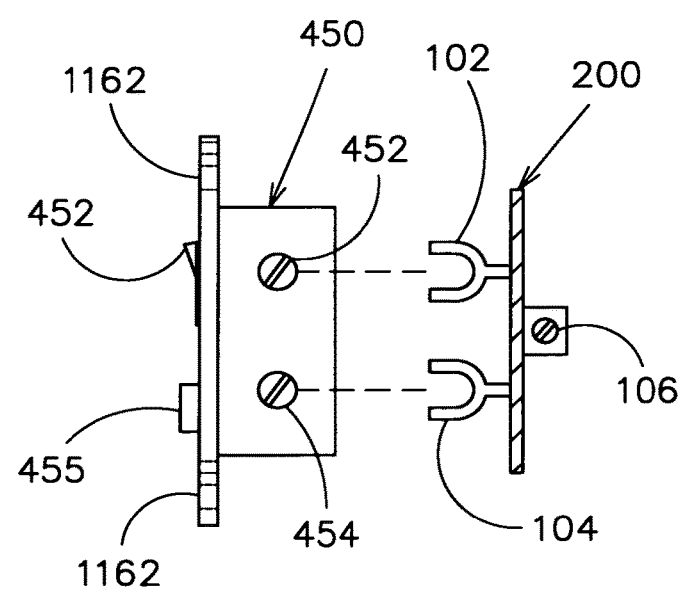
FIG. 14B is a side view of the motion switch and an embodiment of the apparatus.

FIGS. 12-14 show different embodiments of switch combinations: a dimmer switch shown in FIGS. 12A-B, a timer switch shown in FIGS. 13A-B, and a motion switch shown in FIG. 14A-B.

FIG. 12A show a front view of a dimmer switch 750 with a sliding switch dimmer controls 165 and an ON/OFF rocker type switch 1160. The dimmer switch 750 has mounting flanges and holes 1162 to mount the dimmer 750 into the electrical box. FIG. 12B shows the side view of the dimmer switch 750 and the attachment of the apparatus 200 to the dimmer switch. The terminals 102 and 104 of the apparatus 200 are attached to the screw terminals 152 and 154, respectively. The attachment using the screw terminals between the dimmer switch 750 and the apparatus 200 allows for both a physically attachment of the apparatus 200 and an electrical connection. The electrical AC power supply is connected to the screw terminal 152 and the electrical load is connected to the screw terminal 106 of the apparatus 200. The dimmer setting using the slider 165 and the ON/OFF switch 1160 status are monitored by the apparatus 200 via the screw terminal 154 connection of the dimmer switch 750 to the terminal 104 of the apparatus 200. In this embodiment, there are two methods of controlling the electrical AC power supply to the electrical load, in this case a light: the controls on the switch 750 controls the light via the apparatus 200 or a wireless command from a remote controller to the apparatus 200 as described in previous embodiments.

FIG. 13A show a front view of a timer switch 350 with a timing switches 354 and an ON/OFF type switch 352. The timer switch 350 has mounting flanges and holes 1162 to mount the timer 350 into the electrical box. FIG. 13B shows the side view of the timer switch 350 and the attachment of the apparatus 200 to the timer switch 350. The terminals 102 and 104 of the apparatus 200 are attached to the screw terminals 352 and 354, respectively. The attachment using the screw terminals between the dimmer switch 350 and the apparatus 200 allows for both a physically attachment of the apparatus 200 and an electrical connection. The electrical AC power supply is connected to the screw terminal 352 and the electrical load is connected to the screw terminal 106 of the apparatus 200. The timer setting using the switches 354 and the ON/OFF switch 352 status are monitored by the apparatus 200 via the screw terminal 354 connection of the timer switch 350 to the terminal 104 of the apparatus 200. In this embodiment, there are two methods of controlling the electrical AC power supply to the electrical load: the timing controls on the switch 350 controls the light via the apparatus 200 or a wireless command from a remote controller to the apparatus 200 as described in previous embodiments.

FIG. 14A show a front view of a motion switch 450 with a motion sensor 455 and an ON/OFF type switch 452. The motion switch 450 has mounting flanges and holes 1162 to mount the timer 350 into the electrical box. FIG. 14B shows the side view of the motion switch 450 and the attachment of the apparatus 200 to the motion switch 450. The terminals 102 and 104 of the apparatus 200 are attached to the screw terminals 452 and 454, respectively. The attachment using the screw terminals between the motion switch 450 and the apparatus 200 allows for both a physically attachment of the apparatus 200 and an electrical connection. The electrical AC power supply is connected to the screw terminal 452 and the electrical load is connected to the screw terminal 106 of the apparatus 200. The motion sensor 455 and the ON/OFF switch 452 status are monitored by the apparatus 200 via the screw terminal 454 connection of the motion switch 450 to the terminal 104 of the apparatus 200. In this embodiment, there are two methods of controlling the electrical AC power supply to the electrical load: the motion switch 450 controls the light via the apparatus 200 or a wireless command from a remote controller to the apparatus 200 as described in previous embodiments.

The terms and descriptions used above are set forth by way of illustration only and are not meant as limitations. Those skilled in the art will recognize that many variations, enhancements and modifications of the concepts described herein are possible without departing from the underlying principles of the invention. For example, the subject matter disclosed in any sentence or paragraph herein can be combined with the subject matter of one or more of any other sentences or paragraphs herein as long as such combinations are not mutually exclusive or inoperable. The scope of the invention should be determined only by the following claims and their equivalents.

What is claimed and desired to be secured by Letters Patent of the United States is:

1. An apparatus for selectively energizing an AC electrical load, said apparatus comprising:
    a module electrically connected to a single-pole single-throw electrical switch, an AC electrical power supply, and said AC electrical load, and wherein said module is physically attached to said electrical switch so as to form a combined physical unit;
    a relay mounted on said module coupled between said AC electrical power supply and said AC electrical load for controlling the flow of a current to said AC electrical load; and,
    at least one wireless controller mounted on said module and configured to enable the relay in response to one or more commands received over a wireless connection or from input of said electrical switch which one side of said electrical switch is connected to said AC electrical power supply and the other side of said electrical switch is connected to input of the wireless controller.

2. The apparatus in claim 1, wherein said module is affixed to said electrical switch via one or more screw terminals of said electrical switch, one or more push-in terminals of said electrical switch, one or more printed circuit board pads to the screw terminals of said electrical switch, glue joints, fasteners, terminals, or a combination of the foregoing.

3. The apparatus in claim 1, wherein the relay is a TRIAC, a SCR, or a mechanical relay.

4. The apparatus in claim 1, wherein the wireless controller is a Bluetooth module, a Zigbee module, a Wi-Fi module, a Wi-Fi direct module, a Thread module, a Z-Wave module, an Xpress module, a proprietary module, or a multi-protocol module.

5. The apparatus in claim 1, wherein the one or more commands enable the relay, disable the relay, enable the relay temporarily, or request status information.

6. The apparatus in claim 1, wherein the input from the switch enable the relay, disable the relay, or enable the relay temporarily.

7. The apparatus in claim 1, wherein the electrical load is a LED light, a compact fluorescent light, an incandescent light, a motor, a fan, or a heating element.

8. The apparatus in claim 1, wherein the received one or more commands are from a handheld smart device, a laptop computer, a router, a desktop PC, a plug-in home automation module, or a home automation device.

9. An apparatus for selectively energizing an AC electrical load, the apparatus comprising:
    a module electrically and physically connected to a single-pole single-throw electrical switch, an AC electrical power supply, and said AC electrical load, wherein said module is physically attached to said electrical switch so as to form a combined physical unit;
    a thyristor mounted on said module, said thyristor coupled between current leads for controlling the flow of a current from said AC electrical power supply to said AC electrical load;
    a power converter coupled between said AC electrical power supply and said AC electrical load, said power converter configured to convert a small portion of the AC current at the beginning of each half or full AC cycle which appears across the thyristor in each ON and OFF states thereof to form a DC power supply for the module; and
    at least one wireless controller mounted on said module and configured to enable the relay in response to one or more commands received over a wireless connection or from input of said electrical switch which one side of said electrical switch is connected to said AC electrical power supply and the other side of the said electrical switch is connected to input of the wireless controller.

10. The apparatus in claim 9, wherein said module is affixed to said electrical switch via screw terminals of said electrical switch, push-in terminals of said electrical switch, printed circuit board pads, glue, fasteners, or a combination of the foregoing.

11. The apparatus in claim 9, wherein the thyristor is a TRIAC or a SCR.

12. The apparatus in claim 9, wherein the wireless controller is Bluetooth module, a Zigbee module, a Wi-Fi module, a Wi-Fi direct module, a Thread module, a Z-Wave module, Xpress module, a proprietary module, or a multi-protocol module.

13. The apparatus in claim 9, wherein the one or more commands enable the relay, disable the relay, enable the relay temporarily, or request status information.

14. The apparatus in claim 9, wherein the input from the switch enable the relay, disable the relay, or enable the relay temporarily.

15. The apparatus in claim 9, wherein the electrical load is a LED, a fluorescent light, an incandescent light, a motor, a fan, or a heating element.

16. The apparatus in claim 9, wherein the one or more commands are from a handheld smart device, a laptop computer, a router, a desktop PC, a plug-in home automation module, or a home automation device.

17. A method for selectively energizing an AC electrical load, the method comprising:
- providing a module for controlling an AC electrical power to said AC electrical load;
- physically attaching said module to a single-pole single-throw electrical switch so as to form a combined physical unit;
- controlling the current flow from said AC electrical power to said AC electrical load via a relay mounted on said module, said relay coupled between current leads from said AC electrical power supply to said AC electrical load;
- receiving, at the module, one or more commands over a wireless connection or input entered by manipulation of said electrical switch; and
- controlling said relay in response to said commands or said input, wherein one side of said electrical switch is connected to said AC electrical power supply and the other side of said electrical switch is connected to the module.

* * * * *